US007408357B2

(12) United States Patent
Adam et al.

(10) Patent No.: US 7,408,357 B2
(45) Date of Patent: Aug. 5, 2008

(54) DEVICE FOR DETECTING CONTACT WEAR IN SWITCHING APPLIANCES

(75) Inventors: Bernd Adam, Berlin (DE); Michael Hahn, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 304 days.

(21) Appl. No.: 10/573,818

(22) PCT Filed: Sep. 17, 2004

(86) PCT No.: PCT/DE2004/002121

§ 371 (c)(1), (2), (4) Date: Mar. 28, 2006

(87) PCT Pub. No.: WO2005/031774

PCT Pub. Date: Apr. 7, 2005

(65) Prior Publication Data

US 2007/0001677 A1 Jan. 4, 2007

(30) Foreign Application Priority Data

Sep. 29, 2003 (DE) ................................ 103 45 183

(51) Int. Cl.
*G01R 31/327* (2006.01)
*G01N 27/00* (2006.01)

(52) U.S. Cl. ...................................... 324/415; 324/71.2

(58) Field of Classification Search ................. 324/415, 324/418, 420, 421, 423, 424, 537, 538, 700, 324/71.1, 71.2, 76.11; 73/86
See application file for complete search history.

(56) References Cited

U.S. PATENT DOCUMENTS

| | | | | |
|---|---|---|---|---|
| 3,925,722 | A * | 12/1975 | Fohrhaltz et al. | 324/415 |
| 4,626,656 | A | 12/1986 | Ootsuka et al. | |
| 5,747,984 | A | 5/1998 | Amft et al. | |
| 5,844,331 | A * | 12/1998 | Kieser et al. | 307/137 |
| 7,109,720 | B2 * | 9/2006 | Baurand et al. | 324/421 |

FOREIGN PATENT DOCUMENTS

| | | | |
|---|---|---|---|
| DE | 43 09 177 | A1 | 9/1994 |
| DE | 197 27 986 | A1 | 2/1999 |
| DE | 101 09 952 | A1 | 9/2002 |
| EP | 0 462 197 | B1 | 5/1996 |
| EP | 1 022 904 | A1 | 7/2000 |

OTHER PUBLICATIONS

International Search Report (PCT/ISA/210).

* cited by examiner

*Primary Examiner*—Vincent Q. Nguyen
*Assistant Examiner*—Hoai-An D Nguyen
(74) *Attorney, Agent, or Firm*—Harness, Dickey & Pierce, PLC

(57) ABSTRACT

A device for detecting wear of switching contacts in an electric switch appliance is disclosed, the wear of the contacts being caused at least at a pair of switching contacts appliance. The device includes a lightwave guide and a detector. A light exiting from at least one light source is capable of being injected into the lightwave guide and guided by the lightwave guide up to the detector. The lightwave guide is arranged relative to the pair(s) of switching contacts, such that the intensity of the light injected in the lightwave guide, which is measured by the detector, decreases in the switching appliance as the number of wear particles of contacts generated by the wear of the contacts increases.

24 Claims, 3 Drawing Sheets

DEVICE FOR DETECTING CONTACT WEAR IN SWITCHING APPLIANCES

This application is the national phase under 35 U.S.C. § 371 of PCT International Application No. PCT/DE2004/002121 which has an International filing date of Sep. 17, 2004, which designated the United States of America and which claims priority on German Patent Application number 103 45 183.8 filed Sep. 29, 2003, the entire contents of which are hereby incorporated herein by reference.

FIELD

The present invention generally relates to an apparatus for detection of contact erosion in switching devices. In at least one embodiment, it relates to an apparatus for detection of contact erosion on the switching contacts in an electrical switching device.

BACKGROUND

The opening and closing switching contacts for switching currents in an electrical switching device result in switching arcs between the switching contacts. These switching arcs lead to increasing contact erosion on the switching contacts, and thus to wear of the switching contacts. Since this wear influences the switching behavior of the switching device, the contact erosion of the switching contacts must be monitored.

EP 1 022 904 A1 discloses the use of a camera for imaging monitoring of the wear of the switching contacts. Another apparatus which is disclosed in EP 1 022 904 A1 for monitoring the wear is numerical monitoring with the aid of a switching operation counter, or numerical monitoring on the basis of addition of the disconnection currents.

DE 101 09 952 A1 discloses an arrangement by which a fault arc in an electrical switchgear assembly can be identified by way of an optical waveguide. For this purpose, the light originating from a fault arc that occurs is injected radially into the optical waveguide, and is passed to a detector. The injected and detected light is then used in a disturbance light detection circuit to identify whether a fault arc has occurred.

SUMMARY

An object of at least one embodiment of the present invention is to specify a further apparatus for monitoring of the wear of switching contacts in electrical switching devices.

An object may be achieved by an apparatus of at least one embodiment, in which the contact erosion is produced on at least one opening and closing switching contact pair in the switching device, and the apparatus has at least one optical waveguide and at least one detector, in which case light which originates from at least one light source can be injected into the at least one optical waveguide and can be passed from the optical waveguide to the at least one detector, and the at least one optical waveguide is arranged with respect to the at least one switching contact pair such that the intensity (as measured by the at least one detector) of the light which is injected into the optical waveguide decreases as the number of contact erosion particles which are produced by the contact erosion in the electrical switching device increases.

As the number of switching processes increases, and thus as the number of recurrent switching arcs increases, the contact erosion which this causes on the switching contacts leads to increased accumulation of contact erosion particles, and thus to an increasing level of contamination in the electrical switching device. On the basis of the fundamental principle of at least one embodiment of the present invention, this increasing level of contamination is now used as a measure for assessment of the contact erosion, and thus for monitoring of the wear of the switching contacts in the electrical switching device.

According to at least one embodiment of the present invention, this level of contamination is determined with the assistance of the at least one optical waveguide and of the at least one detector. Thus, one or more optical waveguides is or are arranged with respect to the at least one switching contact to be monitored such that the light which originates from a light source and enters one of the optical waveguides is attenuated to an ever greater extent as the number of contact erosion particles increases, and thus as the level of contamination increases. The light which enters the one or more optical waveguide or waveguides is carried by the optical waveguide or waveguides to one or else more detectors. In this case, an optical waveguide can guide the entering light precisely to one, or else to a plurality, of the detectors. On the other hand, the light which enters a plurality of optical waveguides which are jointly associated with the at least one switching contact can also be guided to one, and only to one, detector.

In all of these cases, the at least one detector measures the intensity of the light which is injected into the at least one optical waveguide. On the basis of the measured intensity of the light entering the optical waveguide when the switching device is in the required state, that is to say for example in the case of a new switching device, the contact erosion. Thus, the wear of the at least one associated switching contact, can then be monitored by repeated measurement and evaluation of the intensity of the light entering the at least one optical waveguide.

The apparatus according to at least one embodiment of the invention thus allows non-contacting monitoring using opto-electronic device(s). Furthermore, the apparatus according to at least one embodiment of the invention allows determination of the contact erosion without the switching device itself having to be removed from its actual operating location for this purpose. The required calibration of the measured intensity with respect to the state of the switching contacts and thus with respect to the level of wear is defined as a function of the respective embodiment of the switching device and may, for example, be based on empirically determined values.

The arc which is produced by the opening and closing switching contacts is preferably itself used as the light source for the apparatus according to the invention. In order to also use different light intensities of different switching arcs, computerized standardization can be used in a suitable manner for this purpose. This standardization should also include, in particular, possible changes in the light intensity of the arc which can occur with increasing contact erosion. With standardization such as this, it is then possible during the evaluation to assume that the intensity of the light originating from the arc is virtually constant. It is therefore then possible to deduce the contact erosion on the basis of the measurement of the intensity of the light which originates from the arc, is increasingly attenuated by the contact erosion particles, and is injected into the at least one optical waveguide, and thus to monitor the wear of the switching contacts.

In a further embodiment, a light-emitting diode, in particular, is provided as the light source and, together with the at least one optical waveguide, forms a light barrier. In this case, the light barrier must be arranged with respect to the at least one switching contact pair such that the light which originates from the light-emitting diode and is injected into the at least one optical waveguide is attenuated by the contact erosion particles which are located in the space between the light-emitting diode and the optical waveguide. If commercially available light barriers, which comprise one and only one optical waveguide and one light-emitting diode, are preferably used, the wear can be monitored by very simple device (s).

In a further embodiment, a further optical waveguide is provided as the light source. Since an optical waveguide is an intrinsically passive element, light must, of course, first be injected in a suitable manner from a lighting device, for example from a light-emitting diode, into this further optical waveguide. If the light is carried by this further optical waveguide such that the light emerges on one of its end faces, this end face can be regarded as a light source for the apparatus according to at least one embodiment of the invention, and, together with the first optical waveguide, can form a light barrier. This makes it possible to arrange all of the electrical components that are required for at least one embodiment of the present invention, such as the lighting device(s) or else detectors, outside the actual switching device.

In one alternative embodiment, the light is carried by the further optical waveguide, which acts as the light source, such that it emerges radially over its length. This continuous emergence of light results in the intensity which remains in the optical waveguide decreasing ever further as the length increases, that is to say as the distance from the lighting device(s) increases. The intensity of the emerging light thus also decreases to an ever greater extent as the distance from the lighting device(s) increases. It is thus now possible by suitable arrangement of the further optical waveguide with respect to the switching contact pair to be monitored to include a local weighting in the detection of the contact erosion.

In a further embodiment, a plate is provided between the light source and the at least one optical waveguide, has a defined transmission level for the light originating from the light source, and is arranged with respect to the switching contacts such that contact erosion particles can be deposited on the plate. As the contact erosion increases, ever more contact erosion particles are then deposited on the plate, so that the transmission level for the light passing through the plate decreases to an ever greater extent. The level of contact erosion, and thus the wear of the switching contacts, can then once again be deduced from the decrease that this results in in the intensity of the light which is injected into the optical waveguide.

The apparatus according to at least one embodiment of the invention allows at least one switching contact pair to be monitored, that is to say one or else more switching contact pairs is or are monitored by a common arrangement including at least one optical waveguide and at least one detector. This common arrangement then makes it possible to produce an overall statement relating to the contact erosion on this at least one switching contact pair. In a further embodiment, at least one optical waveguide can be provided in particular for each switching contact pair in a multipole switching device. The level of erosion and thus the wear of the individual switching contact pairs can thus be monitored separately.

If a signal which corresponds to the light intensity as measured by the at least one detector is transmitted to a tripping unit for the electrical switching device, then the switching device can be controlled by this tripping unit. If the measured light intensity falls below a specific value as a result of the number of contact erosion particles becoming ever greater, the tripping unit will identify that a critical level of wear has been reached, and will prevent further switching of the electrical switching device.

If the intensity as measured by the at least one detector is transmitted via a suitable method/device, for example without the use of wires, for further evaluation, then the evaluation can also be evaluated, and the switching device thus monitored, at a location well away from the switching device. In particular, this then makes it possible to remotely signal the state of the switching contacts even during operation of the circuit breaker. Switching contact wear can thus be identified at an early stage, so that precautionary maintenance can then be carried out.

The apparatus according to at least one embodiment of the invention for detection of contact erosion is preferably used for low-voltage circuit breakers or for contactors.

BRIEF DESCRIPTION OF THE DRAWINGS

Advantageous embodiments of the invention will be described in more detail in the following text with reference to the following figures, in which.

DETAILED DESCRIPTION OF THE EXAMPLE EMBODIMENTS

In order to simplify the description of embodiments of the present invention, the example embodiments illustrated in FIGS. 1 to 4 always have one and only one light source Q, one optical waveguide LWL for injection of the light originating from the light source, and one detector D for one switching contact pair. In more complex arrangements, at least one optical waveguide is provided instead of the single optical waveguide LWL shown, and at least one detector is provided for the apparatus according to at least one embodiment of the invention instead of the single detector D.

FIGS. 1-4 show various embodiments of an electrical switching device S. The switching device S has a first switching contact K1 and a second switching contact K1'. One of the switching contacts can in this case be moved in a suitable manner so that, when appropriately driven, the contacts can be moved towards one another or away from one another. Corresponding switching currents can then be switched by the switching contact pair including the switching contacts K1 and K1'. When heavy currents are switched, such as those which are normally switched in the case of low-voltage circuit breakers or in the case of contactors, an arc is struck between the switching contacts K1 and K1' on opening and closing of the switching contact pair K1, K1'. This arc results in increasing erosion of the switching contacts K1 and K1' as the number of switching processes rises, and thus in increasing wear on the switching device S. If the erosion is excessive, the switching device S can no longer reliably switch the currents to be switched, and must be replaced.

Figure 1:
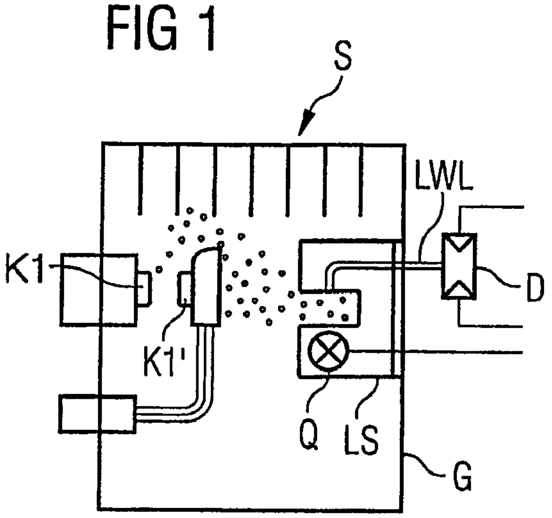
FIG. 1 shows, schematically, a first embodiment with a light-emitting diode as the light source.

Various methods and apparatuses for identification of wear are already known. The apparatus according to at least one embodiment of the invention for monitoring, that is to say for detection, of contact erosion will now be described with reference to a number of example embodiments. An optical waveguide LWL and a light source Q are provided for this purpose, as is shown in FIG. 1. This light source Q is, for example, a light-emitting diode which, together with the optical waveguide LWL, forms a commercially available light barrier LS.

The light which originates from the light source Q will have a specific intensity, depending on the nature of the light source and its drive. Corresponding to the arrangement of the light source Q and of the optical waveguide LWL, a specific portion of the light is injected into the optical waveguide LWL, and is passed by it to a detector D. In the case of a new switching device S, the intensity as measured by the detector D of the light which is injected into the optical waveguide LWL will have a defined magnitude, that is to say a required value.

As the contact erosion of the switching contacts K1 and K1' increases, the number of contact erosion particles in the enclosure G of the electrical switching device S will increase. If these contact erosion particles now enter the area between the light source Q and the optical waveguide LWL, then the light which originates from the light source Q and enters the optical waveguide LWL is attenuated by these contact erosion particles. Thus, the greater the number of contact erosion particles within the enclosure G and thus in the area between the light source Q and the optical waveguide LWL, the less the intensity, as measured by the detector D, of the light injected into the optical waveguide LWL will be. Once a relationship between the contact erosion and the number of contact erosion particles located in the switching device S has been established, the wear of the switching contacts K1 and K1', and thus the wear of the switching device S, can be monitored on the basis of the decrease (resulting from the number of contact erosion particles) in the intensity of the light which is injected into the optical waveguide.

Figure 2:
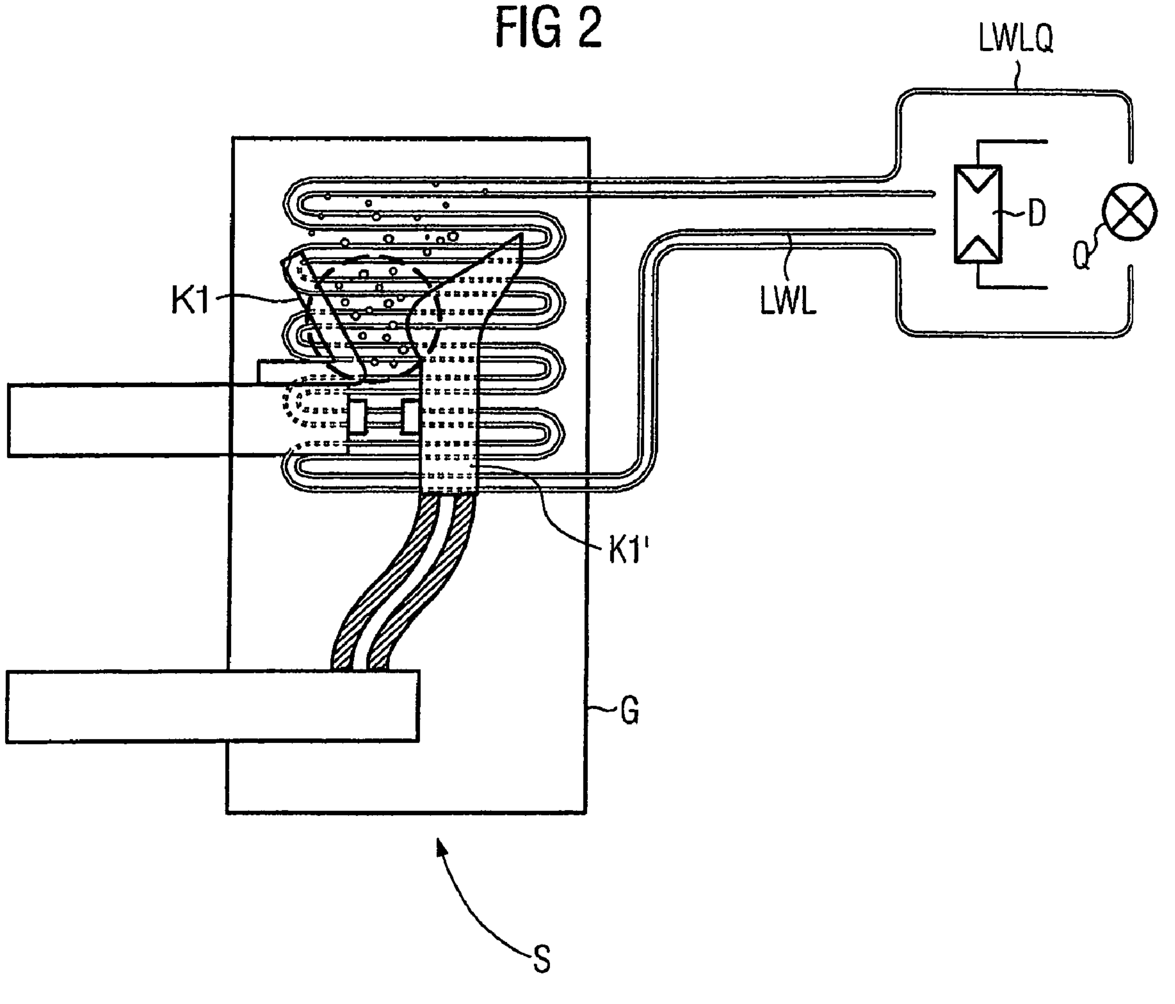
FIG. 2 shows a second embodiment with a further optical waveguide as the light source.

FIG. 2 shows a further embodiment of the electrical switching device S with the two switching contacts K1 and K1', in more detail. The form of the switching contacts K1 and K1' as shown here result in increased contact erosion in the marked area, and thus in increased contamination. If this locally greater contamination is intended to be taken into account in the detection of the contact erosion, a development of the apparatus according to at least one embodiment of the invention is advantageous.

In the embodiment shown in FIG. 2, the apparatus according to at least one embodiment of the invention thus includes an optical waveguide LWL for injection of light, and a further optical waveguide LWLQ, which is in the form of a light source. In the embodiment illustrated here, light from a lighting device Q is injected into this further optical waveguide, which acts as a light source, at both ends of the further optical waveguide LWLQ.

The further optical waveguide LWLQ is in this case designed such that the light carried in it emerges radially over its length. This permanent light emergence will result in the intensity of the light which emerges radially from the further optical waveguide LWLQ decreasing ever further as the distance from the lighting device Q increases. Thus, in the case of the arrangement shown in FIG. 2, light with the least intensity will emerge from the further optical waveguide LWLQ in the marked area. Since this area, which is surrounded by a dashed line, is, however, also the area with the greatest contamination, the light which already emerges with reduced intensity radially from the further optical waveguide LWLQ is, furthermore, even more strongly attenuated than in other areas.

The light which enters the optical waveguide LWL which is arranged, for example, parallel to the further optical waveguide LWLQ will thus then also always have a weaker intensity in the marked area than the light which is injected into the optical waveguide LWL in the other areas. Since the intensity for the light which is injected into the optical waveguide LWL and is passed to the detector D is determined over all of the physically injected light components, the light which enters from the marked area will be included with a different weighting in the determination of the intensity, and thus in the assessment of the contact erosion, than the light which is injected into other areas.

In addition to the arrangement of the optical waveguide LWL and further optical waveguide LWLQ shown in FIG. 2, many other arrangements are also feasible, and are also covered by embodiments of the invention. For example, an arrangement is also feasible in which the optical waveguides LWL and LWLQ are designed only in the form of a single loop, rather than in a meandering shape. Furthermore, it is feasible for the two optical waveguides LWL and LWLQ to be arranged such that the switching contact pair K1, K1' is located between the optical waveguide LWL and the further optical waveguide LWLQ. In this embodiment, a plurality of optical waveguides or detectors can also be provided to monitor the single switching contact pair without any problems as has already been described above, instead of the single optical waveguide LWL and the single detector D.

Figure 3:
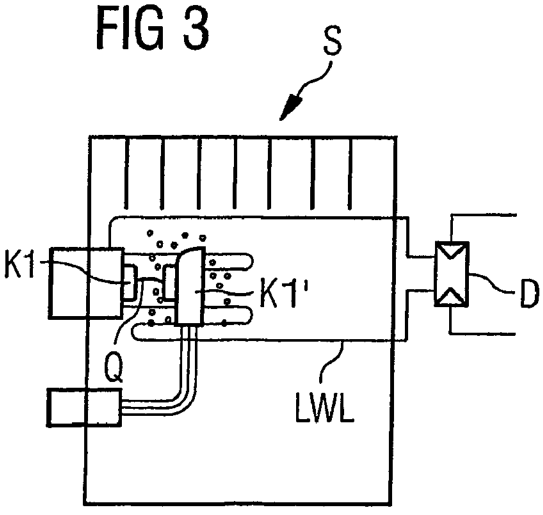
FIG. 3 shows, schematically, a third embodiment with the arc as the light source.

In the third embodiment, which is illustrated schematically in FIG. 3, the arc which is produced by the opening and closing switching contacts K1 and K1' is itself the light source Q. Only one optical waveguide LWL and one detector D are then additionally required in order to detect the contact erosion by the apparatus according to at least one embodiment of at least one embodiment of the invention, and thus to monitor the wear of the switching device S.

As the erosion increases, the number of contact erosion particles produced by the erosion between the arc Q and the optical waveguide LWL will increase, so that the light which originates from the arc Q is attenuated to an ever greater extent before it enters the optical waveguide. The wear of the switching device can thus once again be monitored indirectly on the basis of the intensity of the light which is injected into the optical waveguide LWL and is passed to the detector D. The intensity of the light which originates from the arc and may vary during the course of operation, that is to say as the number of switching processes carried out increases, must be determined empirically and must be taken into account in an appropriate standardization process during monitoring.

Figure 4:
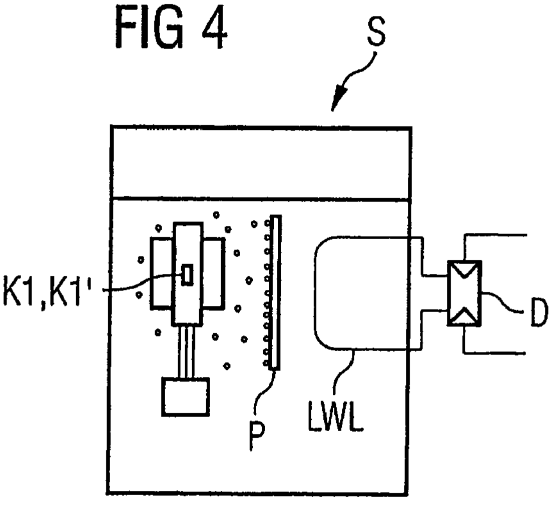
FIG. 4 shows, schematically, a fourth embodiment with a plate between the light source and the optical waveguide.

FIG. 4 shows, schematically, a fourth embodiment in which the arc is once again the light source Q. In this case, a plate P on which the contact erosion particles can accumulate is additionally provided between the arc Q and the optical waveguide LWL. Thus, ever more contact erosion particles will be deposited on the plate P as the erosion increases, as a result of which the transmission level for the light transmitted from the arc to the optical waveguide decreases continuously, that is to say it is attenuated to an ever greater extent. The wear of the switching device can thus once again be monitored indirectly on the basis of the intensity of the light which is injected into the optical waveguide LWL and is passed to the detector D.

The plate P which is shown in FIG. 4 may also be used without any problems in conjunction with an embodiment as shown in FIG. 1 or 2. The plate P itself could also be a window in the enclosure, with the light originating from the arc being transmitted via the plate P to an optical waveguide LWL arranged outside the enclosure, and being injected into this optical waveguide LWL.

In addition to the embodiments described so far, a large number of further embodiments or combinations of apparatuses according to the invention are also feasible, provided that the fundamental principle of the present invention is satisfied, specifically that the contact erosion of the switching contacts K1 and K1', and thus the wear of the electrical switching device S, is monitored indirectly with the assistance of the contact erosion particles.

Figure 5:
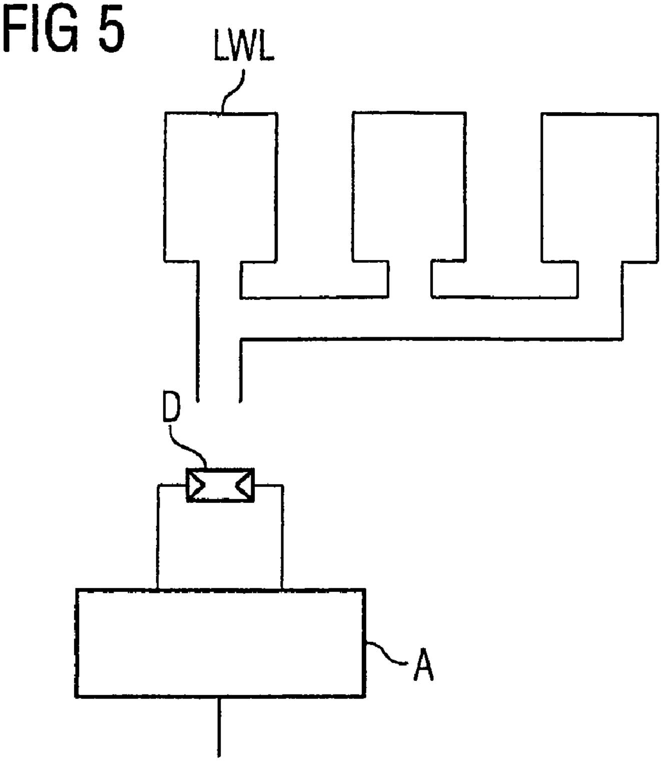
FIG. 5 shows an optical waveguide arrangement for a plurality of switching contact pairs.

So far, embodiments of the present invention has been described only with reference to an electrical switching device S with one switching contact pair K1, K1'. By way of example, FIG. 5 shows a possible arrangement of the optical waveguide LWL for a multipole switching device with three switching contact pairs. In this case, the optical waveguide has three loops, with each of the loops being associated with one switching contact pair of the switching device. In this case, the illustration does not show the light sources.

However, as stated in the example embodiments described above, these light sources may either be the arc itself or an additional light source, in particular a light-emitting diode or a further optical waveguide. The intensity of the light which originates from the respective light source Q, is injected into the optical waveguide LWL and is passed on from this optical waveguide LWL can thus be measured for each of the switching contact pairs by the detector D, and can then be transmitted to a tripping unit A. This tripping unit will control the electrical switching device as a function of the measured intensity of the light.

Figure 6:
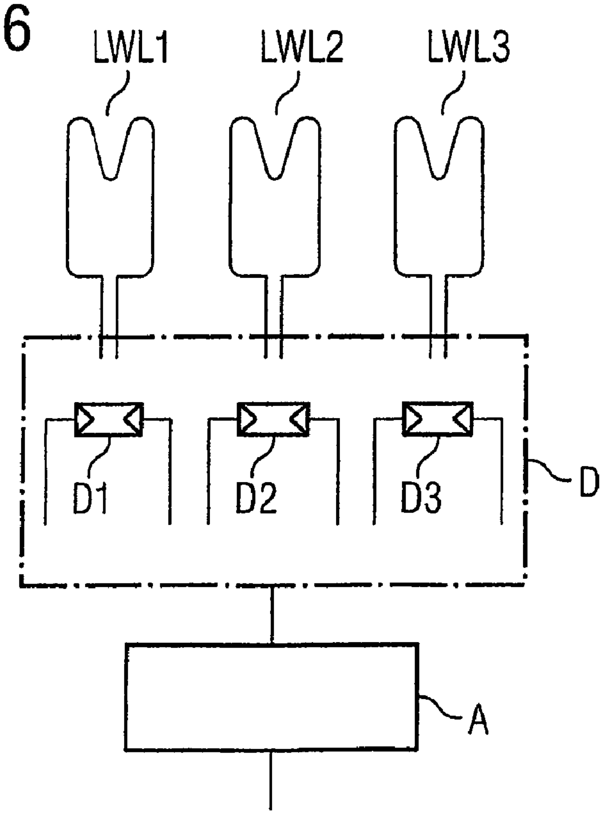
FIG. 6 shows an arrangement of three optical waveguides for three switching contact pairs.

If the measured light intensity falls below a specific value as a consequence of an ever greater number of contact erosion particles for only one of the switching contact pairs, the tripping unit A will recognize that a critical level of wear has been reached at least for this switching contact pair, and will prevent further switching of all the switching contact pairs in the multipole electrical switching device S. If the switching contact pairs in a multipole switching device are intended to be monitored separately, then a dedicated optical waveguide LWL1, LWL2 and LWL3 as well as an associated detector D1, D2 and D3 can be provided for each switching contact pair, as shown in FIG. 6. If the individual switching contact pairs are switched with a time offset and if this time information is available to a detector, then the three detectors D1, D2 and D3 can be replaced by a single detector D, as indicated by a dashed line in FIG. 6. The intensities which are measured by the detectors D1, D2 and D3 or the detector D can then once again be transmitted to the tripping unit A, which can then react appropriately, as already described above.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An apparatus for detection of contact erosion on switching contacts in an electrical switching device, the contact erosion being produced on at least one opening and closing switching contact pair in the switching device, the apparatus comprising:

at least one optical waveguide; and at least one detector, wherein light which originates from at least one light source is injectable into the at least one optical waveguide and passable from the optical waveguide to the at least one detector, the at least one optical waveguide being arranged with respect to the at least one switching contact pair such that intensity, as measured by the at least one detector, of light when injected into the at least one optical waveguide decreases as the number of contact erosion particles produced by the contact erosion in the electrical switching device increases.

2. The apparatus as claimed in claim 1, wherein the at least one light source is an arc produced by the opening and closing switching contact pair.

3. The apparatus as claimed in claim 1, wherein the at least one light source is at least one light emitting diode which, together with the at least one optical waveguide, forms a light barrier.

4. The apparatus as claimed in claim 1, wherein the at least one light source is a further optical waveguide.

5. The apparatus as claimed in claim 4, wherein the light from the further optical waveguide is adapted to emerge on one of its end faces, and this end face together with the at least one optical waveguide forms a light barrier.

6. The apparatus as claimed in claim 4, wherein the light from the further optical waveguide is adapted to emerge radially over its length.

7. The apparatus as claimed in claim 1, further comprising:

a plate, arranged between the light source and the at least one optical waveguide, including a transmission level for the light originating from the light source, is the plate being arranged with respect to the at least one switching contact pair such that contact erosion particles are deposited on the plate, with the transmission level decreasing as the number of contact erosion particles increases.

8. The apparatus as claimed in claim 1, wherein one switching contact pair of a multipole switching device includes an associated optical waveguide the associated optical waveguide being arranged with respect to the associated switching contact pair such that the measured intensity of the light when injected via the optical waveguide is a measure for the contact erosion of the associated switching contact pair.

9. The apparatus as claimed in claim 1, wherein the detector is adapted to transmit a signal, which corresponds to the measured intensity, to a tripping unit, and the tripping unit is adapted to control the switching device as a function of the signal.

10. The apparatus as claimed in claim 1, wherein the measured intensity is adapted to be transmitted for further evaluation.

11. An electrical switching device comprising an apparatus as claimed in claim 1, wherein the electrical switching device is at least one of a low-voltage circuit breaker and a contactor.

12. The apparatus as claimed in claim 1, wherein the at least one light source includes an arc produced by the opening and closing switching contact pair.

13. The apparatus as claimed in claim 1, wherein the at least one light source includes at least one light-emitting diode which, together with the at least one optical waveguide, forms a light barrier.

14. The apparatus as claimed in claim 12, wherein the at least one light source includes at least one light-emitting diode which, together with the at least one optical waveguide, forms a light barrier.

15. The apparatus as claimed in claim 1, wherein the at least one light source includes a further optical waveguide.

16. The apparatus as claimed in claim 12, wherein the at least one light source includes a further optical waveguide.

17. The apparatus as claimed in claim 14, wherein the at least one light source includes a further optical waveguide.

18. The apparatus as claimed in claim 15, wherein the light from the further optical waveguide is adapted to emerge on one of its end faces, and this end face together with the at least one optical waveguide forms a light barrier.

19. The apparatus as claimed in claim 15, wherein the light from the further optical waveguide is adapted to emerge radially over its length.

20. The apparatus as claimed in claim 2, further comprising:

a plate,arranged between the light source and the at least one optical waveguide, including a transmission level for the light originating from the light source, is the plate being arranged with respect to the at least one switching contact pair such that contact erosion particles are deposited on the plate, with the transmission level decreasing as the number of contact erosion particles increases.

21. An apparatus for detection of contact erosion on switching contacts in an electrical switching device, the apparatus comprising:

means for optically channeling light from at least one light source; and means for detecting contact erosion by measuring intensity of the channeled light, the means for optically channeling light being arranged with respect to the at least one switching contact pair such that the measured intensity of light decreases as a number of contact erosion particles produced by contact erosion in the electrical switching device increases.

22. The apparatus as claimed in claim 21, wherein the at least one light source includes an arc produced by the opening and closing switching contact pair.

23. The apparatus as claimed in claim 21, wherein the means for optically channeling light includes at least one optical waveguide, and the at least one light source includes at least one light-emitting diode which, together with the at least one optical waveguide, forms a light barrier.

24. The apparatus as claimed in claim 21, wherein the means for optically channeling light includes at least one optical waveguide, and wherein the at least one light source includes a further optical waveguide.

* * * * *